United States Patent [19]

Lin

[11] Patent Number: 5,258,648
[45] Date of Patent: Nov. 2, 1993

[54] COMPOSITE FLIP CHIP SEMICONDUCTOR DEVICE WITH AN INTERPOSER HAVING TEST CONTACTS FORMED ALONG ITS PERIPHERY

[75] Inventor: Paul T. Lin, Austin, Tex.

[73] Assignee: Motorola, Inc., Schaumburg, Ill.

[21] Appl. No.: 982,404

[22] Filed: Nov. 27, 1992

Related U.S. Application Data

[63] Continuation of Ser. No. 722,429, Jun. 27, 1991.

[51] Int. Cl.$^5$ .............. H01L 23/48; H01L 23/02; H02B 1/00; H05K 1/00
[52] U.S. Cl. .................. 257/778; 257/774; 257/747; 361/725; 361/714; 361/749
[58] Field of Search .............. 357/65, 68, 80, 81, 357/74; 361/381, 389, 398; 257/668, 672, 698, 712, 746, 747, 774, 778, 783

[56] References Cited

U.S. PATENT DOCUMENTS

| | | | |
|---|---|---|---|
| 4,074,342 | 2/1978 | Honn et al. | 357/68 |
| 4,202,007 | 5/1980 | Dougherty et al. | 357/68 |
| 4,825,284 | 4/1989 | Soga et al. | 357/81 |
| 4,893,174 | 1/1990 | Yamada et al. | 357/68 |
| 4,954,878 | 9/1990 | Fox et al. | 357/81 |

Primary Examiner—Andrew J. James
Assistant Examiner—Carl Whitehead, Jr.
Attorney, Agent, or Firm—Patricia S. Goddard

[57] ABSTRACT

A composite flip chip semiconductor device (10) permits burn-in testing and rework to be performed on the device while also enhancing electrical, thermal, and mechanical device performance. The device includes a semiconductor die (12) having a plurality of bonding pads (14). Also included in the composite device is an interposer (22) having a first surface with a plurality of traces (26). A plurality of vias (24) extend from the first surface of the interposer (22) to a second surface. The semiconductor die (12) is electrically coupled to the plurality of vias of the interposer which in turn is to be coupled to a substrate.

15 Claims, 3 Drawing Sheets

COMPOSITE FLIP CHIP SEMICONDUCTOR DEVICE WITH AN INTERPOSER HAVING TEST CONTACTS FORMED ALONG ITS PERIPHERY

This application is a continuation of prior application Ser. No. 07/722,429, filed Jun. 27, 1991.

CROSS-REFERENCE TO RELATED APPLICATIONS

The present invention is related to: a commonly assigned co-pending patent application by Lin entitled, "PROCESS FOR ENHANCING BURN-IN OF COMPOSITE FLIP CHIP SEMICONDUCTOR DEVICES," Ser. No. 07/722,449, Jun. 27, 1991; and to a commonly assigned co-pending patent application, Ser. No. 07/575,751, filed on Aug. 31, 1990 by Leo Higgins III et al. entitled, "TAB TAPE TRANSLATOR FOR USE WITH SEMICONDUCTOR DEVICES."

FIELD OF THE INVENTION

The present invention is related to semiconductor devices in general, and more specifically to flip chip semiconductor devices and methods of making the same.

BACKGROUND OF THE INVENTION

A flip chip semiconductor device refers to a packageless semiconductor device which is used for mounting to a substrate, such as a printed circuit (PC) board, in a die-down or chip-down position. In other words, an active surface of a semiconductor die which is a component of the device will be facing the substrate. Typically, a flip chip device is mounted to a substrate by forming a plurality of conductive bumps, for example solder bumps, on an active surface of a semiconductor die and electrically coupling these bumps to a corresponding pattern of electrical terminals on a substrate. A common method of coupling the bumps to the terminals is by positioning the active surface of the die adjacent a surface of the substrate such that the bumps align with the electrical terminals. The die and substrate are subjected to a heated environment such that the bump material begins to soften or flow, thereby wetting the electrical terminals. Upon cooling, the bump material hardens and forms a metallurgical bond between the bump on the die and the electrical terminal on the substrate. Flip chip die can also be electrically coupled to a substrate using a combination of solder bumps and solder balls with varying compositions in order to achieve eutectic solder joints.

An advantage in using flip chip technology is that device size can be kept to a minimum since the device does not employ a traditional package body. Furthermore, electrical connections between a semiconductor die and a substrate are confined to an area of the substrate which does not exceed the size of the die. There is no need for wire bonds or for any kind of external lead in order to couple the die to the substrate.

However, a substantial disadvantage in using flip chip technology is that there is not a manufacturable method of burning-in flip chip devices, primarily because such devices lack external leads. Burn-in refers to tests which many semiconductor manufacturers use to screen weak devices before shipping the devices to customers. A common burn-in procedure is to operate the devices at elevated temperatures and high voltages to detect early device failures. Because the devices are being operated during burn-in, the device must be electrically coupled to burn-in testing equipment. A widely accepted burn-in set-up involves affixing a plurality of similar semiconductor devices to a burn-in test board, usually by placing each device in a pre-established test socket which is attached to the board. The board is then electrically connected to the test equipment such that a plurality of devices can be burned-in simultaneously. Flip chip semiconductor devices are not able to be burned-in according to the above procedure because flip chip devices cannot be used in existing test sockets. Conventional test sockets are designed to accommodate external device leads which flip chip devices lack. Most flip chip devices have solder bumps on the active surface of the die so that ordinary test sockets cannot be used for burn-in testing of the devices. For this reason, many manufacturers have chosen not to perform burn-in testing on flip chip devices. As a result, some defective flip chip devices which would otherwise be identified as early failures during burn-in are being sent to customers.

Another disadvantage in using existing flip chip technology is that conductive bumps formed on an active surface of a semiconductor die often require an additional level of metallization to be formed on the die. After forming metallized bonding pads on the die, an additional metal layer is usually deposited and patterned in order to transform the bond pad configuration into a configuration which will match a substrate's electrical terminal configuration. In addition to processing steps related to the extra metal layer, flip chip devices also require at least one additional insulating layer and several masking operations. Adding processing steps in die fabrication increases the probability of creating a defect, thereby lowering device yield. Not only does the additional metal layer adversely impact device fabrication, but the presence of an additional metal layer may increase device capacitance which is undesirable.

Yet another disadvantage associated with flip chip technology is that the ability to perform rework on a device is often restricted. Upon mounting a flip chip device to a substrate, such as a PC board, many device users underfill the mounted device, or in other words fill the space between a semiconductor die and the substrate. Thermally conductive epoxy is one material of choice for flip chip underfill. The purpose in underfilling flip chip devices is to constrain the expansion and contraction of the semiconductor die with respect to the substrate. In general, a semiconductor die has a coefficient of thermal expansion which is quite different than a coefficient of the thermal expansion for the substrate. As a result, the die will expand and contract at a different rate than will the substrate, creating stress on solder joints and a potential for the electrical connections between the die bonding pads and the substrate terminal pads to become open. The use of an underfill material helps to constrain the expansion and contraction of the die, thereby reducing the potential for open connections. However, the use of an underfill material also prohibits rework. If an underfill material is used, it is not possible to remove a defective semiconductor device from a substrate and replace the defective part with a functional part because the underfill material is typically a thermosetting material, i.e. one which is permanently rigid and cannot be softened or flowed.

Because existing technology has the disadvantages set forth above, a need exists for an improved semiconductor device, and more specifically for an improved flip chip semiconductor device and method for making the same which can be burned-in in a manner which is suitable for a manufacturing environment, which does not require a semiconductor die to have an additional layer of metallization beyond the metallization used for internal circuitry, and which has the ability to be reworked without compromising thermal and mechanical performance. Furthermore, it is desirable for such a device to be able to be fabricated cost-effectively.

SUMMARY OF THE INVENTION

The foregoing need is met and other advantages are achieved with the present invention. In one embodiment, a composite flip chip semiconductor device has a single semiconductor die having an integrated circuit formed thereon and a plurality of bonding pads electrically coupled to the integrated circuit. The device also has an interposer having first and second surfaces and a plurality of vias extending from the first surface to the second surface. The first surface of the interposer has a plurality of conductive traces which are electrically coupled to the plurality of vias. Means for electrically coupling the plurality of bonding pads to the plurality of traces are included in the device as well as means for electrically coupling the plurality of vias to a substrate.

These and other features, and advantages, will be more clearly understood from the following detailed description taken in conjunction with the accompanying drawings. It is important to note the drawings may not be drawn to scale, but are simply illustrated to point out various features of the present invention. The specific embodiments and features illustrated are not intended to limit the scope of the invention.

DETAILED DESCRIPTION OF A PREFERRED EMBODIMENT

Although flip chip semiconductor devices have a significant advantage in that the devices are very small, flip chip devices also have several disadvantages. As mentioned in the background discussion, flip chip devices are unable to be burned-in using existing testing equipment, require additional metallization layers and die fabrication steps which potentially degrade device yield, and cannot be reworked once attached to a substrate using an underfill material. The present invention overcomes each of the above drawbacks of existing flip chip devices in addition to having other advantages which will become apparent throughout the discussion. The present invention utilizes an interposer which is coupled to an active surface of a semiconductor die. The interposer has a metallization layer formed on at least one side, thereby eliminating the need for an additional metallization layer on the semiconductor die. Furthermore, the interposer can be designed to include test contacts which permit the composite semiconductor device to be burned-in individually using a test socket or simply by contacting either top-side or edge test contacts. Another advantage of the present invention is that the interposer can be of a material which enhances thermal and mechanical performance of the device without restricting the ability to perform rework. Because the interposer is to be attached to a substrate, as opposed to the semiconductor die being attached to the substrate, an underfill material between the interposer and the substrate will not prevent the semiconductor die from being removed. Thus a defective semiconductor die can be replaced with a functional die even after the flip chip device has been mounted to a substrate.

Figure 1:
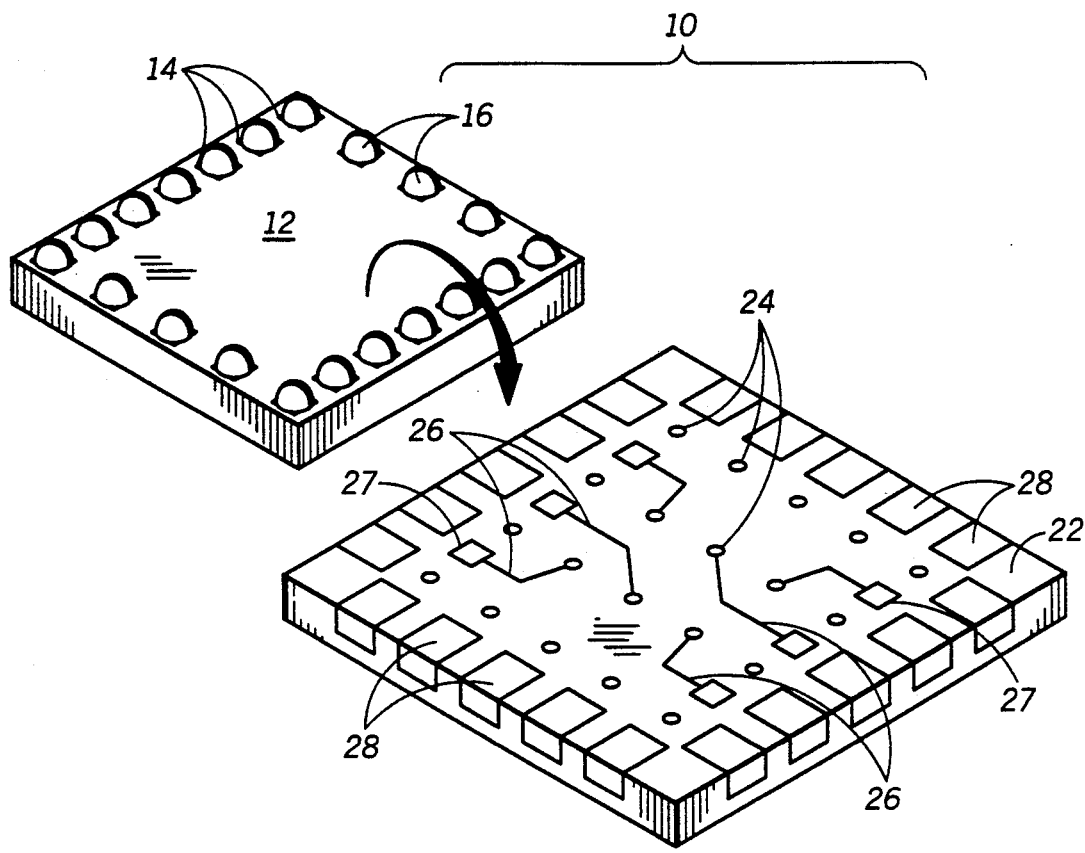
FIG. 1 is a perspective view of a semiconductor die which is to be attached to an interposer in accordance with the present invention to form a composite flip chip semiconductor device.

FIG. 1 illustrates a perspective view of a composite flip chip semiconductor device 10 in accordance with the present invention. The device includes a semiconductor die 12 having a plurality of bonding pads 14 formed on a surface thereof. Bonding pads 14 are electrically coupled in a conventional form to an integrated circuit (not shown) which is also formed on the die. Bonding pads 14 are typically formed along the periphery of the semiconductor die, as illustrated, in order to maximize the number of bonding pads per die without interfering in the layout of the integrated circuit. Formed on each of the bonding pads 14 is a solder bump 16. Solder bumps are well known in the art as a method of coupling a flip chip semiconductor die to a substrate (not shown).

Figure 2:
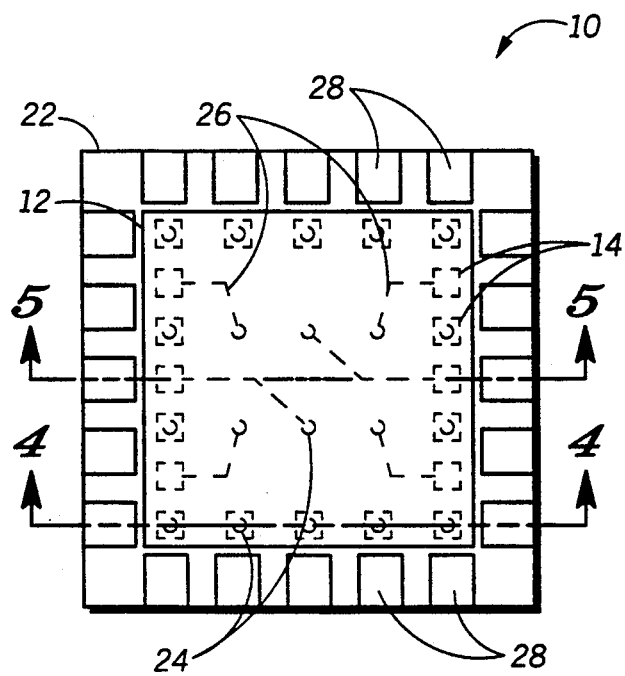
FIG. 2 is a top view of the semiconductor device of FIG. 1 after the semiconductor die has been positioned on the interposer.

In conventional flip chip devices, a layer of metal is often formed on the semiconductor die, making electrical connection to the bonding pads, in order to transpose the peripheral bonding pad configuration to an array configuration. An array configuration of bonding pads and solder bumps is often necessary to correspond with an array of electrical terminals on a PC board or multi-layer ceramic substrate. As mentioned earlier, the additional layer of metal increases the number of processing steps required in die fabrication and can potentially reduce device yield. The present invention does not require an additional layer of metallization on the semiconductor die to transform the peripheral solder bumps into an array configuration. Instead, the present invention incorporates a rigid interposer 22, as illustrated in FIG. 1, to achieve a desired terminal configuration. Semiconductor die 12 is attached to interposer 22 such that solder bumps 16 align to, and are in electrical contact with, a plurality of electrical vias 24 provided in the interposer. The vias may be conveniently formed in a configuration which will match an electrical terminal configuration of a substrate (not shown). For those solder bumps which do not align directly with a via upon positioning the die on the interposer, a plurality of conductive traces 26 are provided on the interposer to electrically route the solder bump to a particular via location. As illustrated, some of the solder bumps 16 are to be coupled to terminal pads 27 formed at an end of the conductive traces rather than directly connected to vias. The conductive traces are routed to the appropriate vias. FIG. 2 illustrates a top view of semiconductor die 12 and interposer 22 after the die has been positioned on the interposer.

Figure 3:
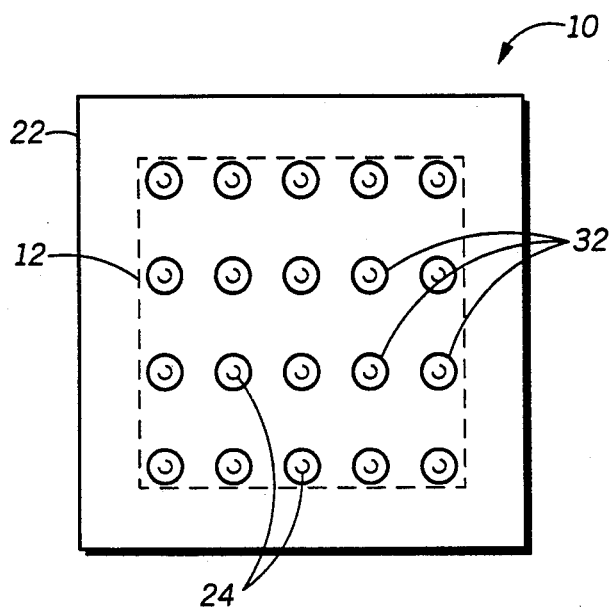
FIG. 3 is a bottom view of the semiconductor device of FIG. 2.

Electrical vias 24 extend from a top surface of interposer 22 to a bottom surface where a plurality of solder balls are formed. FIG. 3 illustrates a configuration of solder balls 32 which correspond with the electrical via configuration of interposer 22. The solder balls also correspond with an electrical terminal configuration of a substrate (not shown). Although each solder ball is illustrated as being positioned directly under a via, conductive traces may also be formed on the bottom surface of the interposer to electrically route the vias to the solder bumps. In other words, solder balls 32 may be offset from vias 24, similar to the way in which some of solder bumps 16 are offset from, and electrically routed to, vias 24 in FIG. 1.

Figure 4:
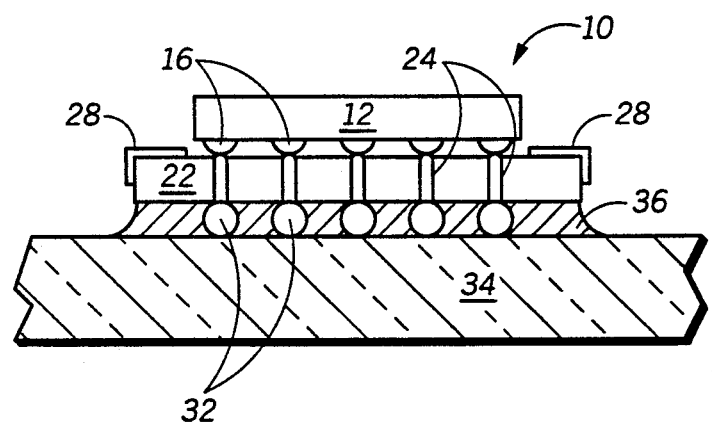
FIG. 4 is a cross-sectional view of the semiconductor device of FIG. 2 taken along the line 4—4.
Figure 5:
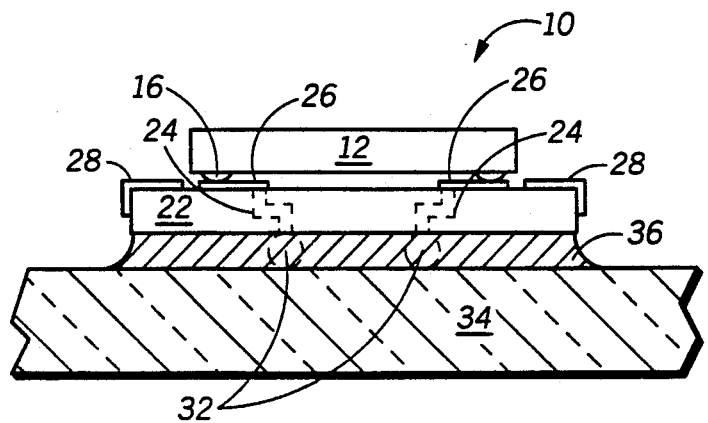
FIG. 5 is a cross-sectional view of the semiconductor device of FIG. 2 taken along the line 5—5.

For a better understanding of a device application, composite flip chip semiconductor device 10 is illustrated in cross-section in FIGS. 4 and 5 as the device might be mounted on a PC board. FIG. 4 is a cross-sectional view of the device taken along the line 4—4 of FIG. 2, while FIG. 5 is a cross-sectional view taken along the line 5—5. In FIG. 4, semiconductor die 12 is coupled to interposer 22 such that solder bumps 16 coincide with vias 24. Beneath each via is a solder ball 32 which in turn is coupled to a substrate such as PC board 34. While die 12 and interposer 22 are essentially separated by air, interposer 22 and PC board 34 are separated by an underfill material 36. As discussed in the background, underfill materials are commonly used between a flip chip semiconductor die and a substrate in order to restrict the thermal expansion and contraction of the die relative to the substrate. However, the use of an underfill material in conventional flip chip devices prevents rework since the underfill materials commonly used, for example thermally conductive epoxies, cannot be reflowed. In an embodiment of the present invention, an underfill material can be used between interposer 22 and PC board 34. Once attached to PC board 34, interposer 22 cannot be removed; however, semiconductor die 12 can easily be removed from the interposer should any rework be necessary simply by heating and flowing solder bumps 16.

FIG. 5 demonstrates how conductive traces 26 can be used to "fan-in" peripheral solder bumps 16 to a predetermined via or solder ball configuration. Solder bumps 16 around the periphery of die 12 are connected to the terminal pads of conductive traces 26 which electrically route the solder bumps to vias 24. The via configuration is an array configuration, as evident in FIG. 1. Vias 24 are not in the plane of the cross-sectional view of FIG. 5 and are thus shown as being hidden. Since the conductive traces 26 of the interposer can be used to fan-in peripheral solder bumps to an array configuration, semiconductor die 12 can be used not only as a flip chip semiconductor die, but alternatively as a conventional wire-bonded or TAB (tape automated bonding) die which typically requires peripheral bonding sites. Therefore, semiconductor die fabrication becomes a standardized process for either flip chip, wire bonded, or TAB devices.

FIG. 5 also demonstrates that vias 24 need not be completely vertical as illustrated in FIG. 4, but may instead be kinked or otherwise slanted. Having the vias kinked requires interposer 22 to be a multi-layer material having more than one conductive layer. The use of a multi-layer interposer provides more flexibility in arranging vias and solder balls while also increasing the number of possible via and solder ball locations since metallization is not restricted to one layer.

There is also an advantage in using only one conductive layer in interposer 22 which relates to ease of manufacturing. By using only one conductive layer, namely a conductive layer on the top of the interposer, vias and solder balls of the interposer can be formed in a predetermined, fixed configuration which is a standard to several different semiconductor die. For example, in reference to FIG. 1, semiconductor die 12 has twenty bonding pads which respectively correspond to twenty vias on interposer 22. The vias are arranged in a regular array which might match a standardized electrical terminal configuration of a substrate (not shown). Numerous types of semiconductor die may have twenty bonding pads, but the bonding pads may not be located precisely in the same locations from die to die. However, interposer 22 can be used for each of the different die having twenty bonding pads simply by changing the metallization pattern which forms conductive traces 26. In other words, one metal layer can be changed to accommodate various bonding pad configurations while the via and solder ball configuration can remain fixed. While an interposer having multiple metal layers can also be used for each of the different bonding pad configurations, more than one of the metal layers will most likely have to be "customized" to accommodate each configuration, thereby increasing the number of manufacturing steps.

In making an interposer which is suitable for use in the present invention, a preferred material is one that has a coefficient of thermal expansion (CTE) which closely approximates that of a semiconductor die. Semiconductor die are, for the most part, formed of silicon which has a CTE of approximately 3 ppm (parts per million)/°C. Therefore, a preferred material for an interposer would be silicon since the CTE of the interposer would match that of the die. However, other materials have a CTE close to the CTE of silicon, for example the CTE of aluminum nitride is on the order of 4.5 ppm/°C. Other ceramics may also be suitable for use as the interposer material. In having the CTE of the interposer and die closely matched, there is a reduced chance that the electrical bonds between the solder bumps and the conductive traces or vias will be broken as a result of thermally induced stress. Furthermore, the closely matched CTEs of the die and the interposer permit the use of rigid joints to couple the die and interposer. Solder is the most common material used to couple flip chip die to any kind of substrate because solder is considered to be a flexible joint which helps to absorb thermally induced stresses. By having the CTE of the interposer closely match that of the semiconductor die, one may instead choose to use a rigid coupling joint, for example a copper joint, for improved electrical performance. Another consideration in choosing a material for the interposer is thermal dissipation. Many semiconductor devices generate a great deal of heat during operation. Using an interposer material with good thermal dissipation properties will help remove heat from a composite flip chip device, thereby increasing device lifetime and improving reliability.

In making an interposer, such as interposer 22, vias and conductive traces can be formed on the interposer using known techniques. For example, screen printing or metal deposition and etching techniques can be used to form conductive traces, while etching or laser drilling can be used to form the vias. The vias must be electrically conductive and therefore will be filled with a conductive material.

Apart from the benefit of providing rework capabilities and improving resistance to thermally induced stress, the use of an interposer in accordance with the present invention also establishes a method of testing and burning-in a flip chip semiconductor device. For instance, interposer 22 of FIG. 1 is provided with a plurality of test contacts 28 located around the interposer periphery. Test contacts 28 may also extend along the sides of the interposer, as illustrated, or may be formed only on the top surface of the interposer. Test contacts are electrically coupled to the solder bumps of die 12 by having the contacts coupled to the vias as discussed below. It should, however, be noted that there need not be a one-to-one correspondence between the test contacts and the vias, depending on the extent of testing to be performed. The electrical connection between the test contacts and the vias is not illustrated for sake of clarity; however, connections between the test contact and the vias can easily be made by at least two methods. One method is to utilize a multi-layer interposer that includes a conductive layer dedicated to coupling the test contacts to the vias. Another method is to form a second plurality of conductive traces on the interposer's top surface to perform the same function. The presence of test contacts 28 permit the use of conventional probe needles (not shown) to test the functionality of the die. Furthermore, having test contacts 28 extend at least partially along a side of the interposer allows the composite flip chip semiconductor device to be tested and burned-in in a known test socket which is capable of handling edge contacts.

Figure 6:
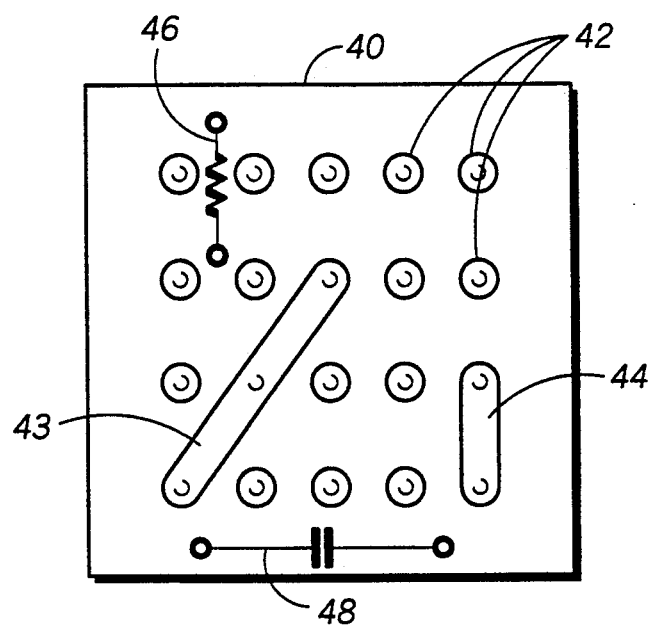
FIG. 6 is a bottom view of an interposer of a composite flip chip semiconductor device also in accordance with another form of the present invention.

Yet another advantage provided by an interposer used in accordance with the present invention is an enhancement in electrical performance of a flip chip semiconductor device. Use of an interposer creates two additional surfaces on which circuitry or electrical components can be formed. For example, FIG. 6 illustrates a bottom surface of an interposer 40 which is suitable for use in the present invention. In addition to a plurality of solder balls 42 which are similar to those of the previously described embodiment of the invention, interposer 40 also includes two electrical components, namely a terminal resistor 46 and a decoupling capacitor 48. The area of the interposer not occupied by solder balls, vias, or conductive traces is available for use for electrical components or may be used for additional power bussing. Therefore, additional circuitry, bussing, or components can be added to a semiconductor device without increasing the size of a flip chip semiconductor die. FIG. 6 also illustrates that common output signals from a device can be coupled together on the bottom of the interposer. For example, terminal groupings 43 and 44 can be used in place of a plurality of solder balls to couple, for example, POWER or GROUND outputs.

The foregoing description and illustrations contained herein demonstrate many of the advantages associated with the present invention. In particular, it has been revealed that a device in accordance with the present invention can be individually burned-in by providing test contacts on an interposer which is coupled to a flip chip semiconductor die. The test contacts can be formed so that the contacts are compatible with a test socket or so that the contacts can be tested with conventional probe needles. Moreover, an interposer substrate can be used to burn-in a plurality of flip chip devices simultaneously, much like conventional burn-in boards but without the need for test sockets. The present invention also eliminates the need for an additional metallization layer on a flip chip semiconductor die. Thus, die fabrication becomes less complicated with potentially higher yields in comparison to existing flip chip fabrication techniques. The additional metal layer is instead formed on an interposer, which is a much more simple fabrication than having to add the metal layer to a die. In addition, eliminating the additional metallization layer makes flip chip semiconductor die compatible for use as wire-bonded or TAB bonded die. Yet another advantage is that an interposer can be used to reduce thermally induced stress in flip chip bonds and can be used to dissipate heat during device operation by choosing an appropriate interposer material. Furthermore, the use of an interposer in a flip chip semiconductor device establishes additional surfaces on which to form circuitry, buses, or other electrical components without having to increase the area of a semiconductor die.

Thus it is apparent that there has been provided, in accordance with the invention, a process for enhancing burn-in of composite flip chip semiconductor devices that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, an interposer used the invention need not be made of silicon or aluminum nitride, instead may be of any material. However, a preferred interposer material is one which has a CTE which is similar to the CTE for the semiconductor die used in the inventive device. In addition, the invention is not limited to use of an interposer which transforms a peripheral bonding pad configuration into an array configuration. Many of the advantages set forth above may be achieved regardless of the configuration of electrical connections. It is also important to note that the present invention is not limited in any way to the use of solder bumps on a semiconductor die. Any method of electrically coupling a semiconductor die to an interposer is within the scope of the present invention. Similarly, methods other than solder balls are suitable for coupling an interposer to a substrate. Also, an interposer need not have test contacts in order to be beneficial, although test contacts permit individual device testing and burn-in. Furthermore, an interposer used in accordance with the present invention need not be larger than a flip chip semiconductor die, as the drawings indicate. However, having the interposer larger than the die establishes more flexibility in testing and burning-in the flip chip device. Additionally, an interposer used in conjunction with the invention is not limited to having conductive traces on a top surface which is opposite a semiconductor die. A bottom surface of the interposer, which would be opposite a substrate, may also include a plurality of conductive traces to route a plurality of vias into a desired configuration. Likewise, an interposer used in accordance with the invention may be of a single-layer or multi-layer material. It should also be noted that circuitry, buses, and electrical components other than those types specifically described or illustrated can also be formed on an interposer surface to enhance or assist in electrical device performance. Moreover, the invention is in no way restricted to use of a particular type of semiconductor die in the device. Therefore, it is intended that this invention encompass all such variations and modifications as fall within the scope of the appended claims.

I claim:

1. A composite flip chip semiconductor device comprising:
   a single semiconductor die having an integrated circuit formed on an active surface thereof and a plurality of peripheral bonding pads on the active surface and electrically coupled to the integrated circuit, the semiconductor die also having a first coefficient of thermal expansion and a predetermined area;
   an interposer having first and second surfaces and a plurality of vias arranged in an array configuration which extend from the first surface to the second surface, the first surface having a plurality of conductive traces electrically coupled to the plurality of vias, the interposer also having a predetermined area, a periphery, and a second coefficient of thermal expansion, the plurality of vias being located within a first portion of the predetermined area of the interposer;
   wherein the active surface of the semiconductor die is joined to the first surface of the interposer, overlying the first portion of the predetermined area of the interposer, such that the plurality of bonding pads are electrically coupled to the plurality of vias by the conductive traces which fan-in the peripheral bonding pads into an array within the first portion of the predetermined area of the interposer;
   wherein the predetermined area of the interposer is large enough to accommodate the semiconductor die;
   wherein the interposer also has a plurality of test contacts formed along the periphery which are electrically coupled to the plurality of bonding pads;
   wherein the predetermined area of the interposer is larger than the predetermined area of the semiconductor die such that plurality of test contacts are exposed to provide electrical access to the semiconductor die from the first surface of the interposer;
   wherein the first and second coefficients of thermal expansions are approximately equal; and
   wherein the second surface of the interposer is directly connected to a printed circuit board.

2. The semiconductor device of claim 1 wherein the the active surface of the semiconductor die is joined to the first surface of the interposer by a plurality of solder bumps.

3. The semiconductor device of claim 1 wherein the second surface of the interposer is connected to the printed circuit board by a plurality of solder balls.

4. The semiconductor device of claim 1 wherein the semiconductor die and interposer are separated in part by air.

5. The semiconductor device of claim 1 wherein the interposer is comprised of a ceramic.

6. The semiconductor device of claim 1 wherein the interposer is comprised of a material selected from the group consisting of aluminum nitride and silicon.

7. A composite flip chip semiconductor device comprising:
   an interposer having first and second surfaces with first and second areas, respectively, having a periphery, and having a plurality of vias arranged in an array and extending from the first surface to the second surface, the first surface having a plurality of traces electrically coupled to the plurality of vias;
   a single semiconductor die having first and second surfaces with first and second areas, respectively, the first surface having a plurality of bonding pads located near a periphery of the semiconductor die, the first surface of the semiconductor die being coupled to, but separated from, the first surface of the interposer such that the plurality of bonding pads are electrically coupled to the plurality of vias by the plurality of conductive traces;
   means for electrically coupling the plurality of vias of the interposer to a printed circuit board; and
   a plurality of test contacts formed on the first surface of the interposer along the periphery, the plurality of test contacts being electrically coupled to the plurality of vias;
   wherein the first area of the interposer is larger than the first area of the semiconductor die, such that the plurality of test contacts are exposed and surround the semiconductor die.

8. The semiconductor device of claim 10 wherein the plurality of bonding pads are electrically coupled to the plurality of vias by the plurality of traces formed on the first surface of the interposer.

9. The semiconductor device of claim 7 wherein the plurality of test contacts continuously extend from the first surface of the interposer to a side of the interposer.

10. The semiconductor device of claim 7 wherein the means for electrically coupling the plurality of vias of the interposer to a substrate comprises a plurality of solder balls.

11. The semiconductor device of claim 7 wherein the interposer is comprised of a material selected from the group consisting of aluminum nitride and silicon.

12. The semiconductor device of claim 1 further comprising an underfill material between the second surface of the interposer and the printed circuit board.

13. The semiconductor device of claim 7 wherein the second surface of the interposer is connected to a printed circuit board by a plurality of solder balls.

14. The semiconductor device of claim 13 wherein the interposer is directly coupled to a printed circuit board and further comprising an underfill material between the interposer and the printed circuit board.

15. The semiconductor device of claim 7 wherein the interposer has a first coefficient of thermal expansion and the semiconductor die has a second coefficient of thermal expansion which is approximately equal to the first coefficient of thermal expansion.

* * * * *